United States Patent
Yee et al.

(10) Patent No.: US 10,178,763 B2
(45) Date of Patent: Jan. 8, 2019

(54) WARPAGE MITIGATION IN PRINTED CIRCUIT BOARD ASSEMBLIES

(71) Applicant: Intel Corporation, Santa Clara, CA (US)

(72) Inventors: Rashelle Yee, Puyallup, WA (US); Russell S. Aoki, Tacoma, WA (US); Shelby Ferguson, Lacey, WA (US); Michael Hui, Tacoma, WA (US); Jonathon Robert Carstens, Lacey, WA (US); Joseph J. Jasniewski, Olympia, WA (US); Kevin J. Ceurter, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 14/975,941

(22) Filed: Dec. 21, 2015

(65) Prior Publication Data

US 2017/0181271 A1    Jun. 22, 2017

(51) Int. Cl.
*H05K 1/02* (2006.01)
*H01L 23/498* (2006.01)
(Continued)

(52) U.S. Cl.
CPC ......... *H05K 1/0271* (2013.01); *B23K 1/0016* (2013.01); *H01L 23/49816* (2013.01);
(Continued)

(58) Field of Classification Search
CPC .. H05K 1/0254; H05K 1/0286; H05K 1/0287; H05K 1/0289; H05K 1/029;
(Continued)

(56) References Cited

U.S. PATENT DOCUMENTS 4,434,321 A    2/1984 Betts
4,481,403 A *  11/1984 Del Monte .......... B23K 1/0004
                                                     219/209
(Continued)

FOREIGN PATENT DOCUMENTS

JP    05175659    7/1993
JP    06291165    10/1994
(Continued)

OTHER PUBLICATIONS

U.S. Appl. No. 14/975,938 entitled "Intergated Circuit Packages with Temperature Sensor Traces," filed Dec. 21, 2015, 36 pages.
(Continued)

*Primary Examiner* — Pete T Lee
(74) *Attorney, Agent, or Firm* — Patent Capital Group

(57) ABSTRACT

Disclosed herein are apparatus, systems, and methods for warpage mitigation in printed circuit board (PCB) assemblies. In some embodiments, a PCB assembly for warpage mitigation may include: a PCB; an interposer disposed on the PCB, wherein the interposer has a first face and an opposing second face, the first face is disposed between the second face and the PCB, conductive contacts are disposed at the second face, solder is disposed on the conductive contacts, the interposer includes a first heater trace proximate to the conductive contacts, and, when a first power is dissipated in the first heater trace, the first heater trace is to generate heat to cause the solder disposed on the conductive contacts to melt; wherein the PCB includes a second heater trace.

25 Claims, 5 Drawing Sheets

(51) Int. Cl.
*H05B 1/02* (2006.01)
*B23K 1/00* (2006.01)
*H05K 1/14* (2006.01)
*B23K 101/42* (2006.01)

(52) U.S. Cl.
CPC .. *H01L 23/49833* (2013.01); *H01L 23/49838* (2013.01); *H05B 1/0233* (2013.01); *H05K 1/0212* (2013.01); *H05K 1/141* (2013.01); B23K 2101/42 (2018.08); H01L 2224/16225 (2013.01); H01L 2924/15311 (2013.01); H05K 2201/041 (2013.01); H05K 2201/10378 (2013.01)

(58) Field of Classification Search
CPC .. H05K 1/0292; H05K 1/0293; H05K 1/0296; H05K 1/14; H05K 3/341; H05K 3/3415; H05K 3/3421; H05K 3/3431; H05K 3/36; H05K 3/46; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0256; H05K 1/0257; H05K 1/0259; H05K 1/026; H05K 1/0263; H05K 1/0265; H05K 1/0278; H05K 1/0284; H05K 1/036; H05K 1/0366; H05K 1/0373; H05K 1/0393; H05K 1/0298; H05K 1/05; H05K 1/11; H05K 1/111; H05K 1/114; H05K 1/117; H05K 1/119; H05K 2201/10378; H05K 3/4602; H05K 3/4691

See application file for complete search history.

(56) References Cited

U.S. PATENT DOCUMENTS

| | | | |
|---|---|---|---|
| 4,730,238 A | 3/1988 | Cook | |
| 5,220,491 A | 6/1993 | Sugano et al. | |
| 5,513,076 A | 4/1996 | Werther | |
| 5,539,186 A | 7/1996 | Abrami et al. | |
| 5,615,477 A | 4/1997 | Sweitzer | |
| 5,622,770 A | 4/1997 | Dowdy et al. | |
| 5,965,944 A | 10/1999 | Frankoski et al. | |
| 6,002,168 A * | 12/1999 | Bellaar | H01L 23/49816 257/693 |
| 6,181,004 B1 | 1/2001 | Koontz et al. | |
| 6,396,706 B1 * | 5/2002 | Wohlfarth | H05K 1/0212 219/388 |
| 7,474,540 B1 * | 1/2009 | Dang | H01L 23/147 174/250 |
| 7,511,228 B2 | 3/2009 | Yaung et al. | |
| 8,411,442 B2 * | 4/2013 | Meinel | H05K 1/0201 174/262 |
| 8,519,304 B2 * | 8/2013 | Bartley | H01L 25/0657 219/162 |
| 8,981,259 B2 * | 3/2015 | Chou | H05B 1/02 219/209 |
| 9,012,811 B2 * | 4/2015 | White | H05B 3/28 219/209 |
| 9,468,089 B2 * | 10/2016 | Sasaki | H01L 24/19 |
| 2004/0195701 A1 | 10/2004 | Attarwala | |
| 2004/0232535 A1 | 11/2004 | Tarn | |
| 2006/0065431 A1 * | 3/2006 | Trucco | H05K 1/0212 174/250 |
| 2006/0231541 A1 * | 10/2006 | Takada | H05K 1/0212 219/209 |
| 2007/0296071 A1 | 12/2007 | Chiu et al. | |
| 2011/0237001 A1 | 9/2011 | Hasebe et al. | |
| 2012/0199830 A1 | 8/2012 | Raravikar et al. | |
| 2014/0307406 A1 * | 10/2014 | Kitajima | H01G 2/065 361/772 |
| 2015/0016083 A1 | 1/2015 | Nootens et al. | |
| 2015/0114707 A1 | 4/2015 | Glickman | |
| 2015/0235986 A1 | 8/2015 | Interrante et al. | |
| 2016/0351526 A1 | 12/2016 | Boyd et al. | |
| 2017/0176260 A1 | 6/2017 | Ferguson et al. | |
| 2017/0178994 A1 | 6/2017 | Hui et al. | |

FOREIGN PATENT DOCUMENTS

| | | |
|---|---|---|
| JP | 08330686 A | 12/1996 |
| JP | 10041606 | 2/1998 |
| JP | 2003106896 | 4/2003 |
| JP | 2011044512 | 3/2011 |
| JP | 2012160602 | 8/2012 |
| WO | 2015152855 A1 | 10/2015 |
| WO | 2017112134 A1 | 6/2017 |
| WO | 2017112135 A1 | 6/2017 |
| WO | 2017112136 A1 | 6/2017 |

OTHER PUBLICATIONS

International Search Report and Written Opinion issued in PCT Application No. PCT/US2016/062117 dated Feb. 28, 2017; 11 pages.
International Search Report and Written Opinion issued in PCT Application No. PCT/US2016-062146 dated Feb. 28, 2017; 11 pages.
International Search Report and Written Opinion issued in PCT Application No. PCT/US2016/062143 dated Feb. 15, 2017; 10 pages.
U.S. Appl. No. 14/975,532 entitled "Semiconductor Package Alignment Frame for Local Reflow", filed Dec. 18, 2015, 79 pages.
U.S. Appl. No. 14/975,938 entitled "Integrated Circuit Packages with Temperature Sensor Traces," filed Dec. 21, 2015, 36 pages.
U.S. Appl. No. 14/975,943 entitled "Integrated Circuit Package Support Structures," filed Dec. 21, 2015, 61 pages.
USPTO Non-Final Office Action issued in U.S. Appl. No. 14/975,943 dated Dec. 13, 2017, 39 pages.
USPTO Final Rejection issued in U.S. Appl. No. 14/975,943 dated Jul. 12, 2018; 16 pages.

* cited by examiner

US 10,178,763 B2

WARPAGE MITIGATION IN PRINTED CIRCUIT BOARD ASSEMBLIES

TECHNICAL FIELD

The present disclosure relates generally to printed circuit board (PCB) assemblies, and more particularly, to warpage mitigation in PCB assemblies.

BACKGROUND

For reliable operation, computing devices must typically be maintained within a "safe" temperature range. Heat generated in computing devices is typically managed by heat sinks and other heat dissipation devices and by restricting the performance of processing devices to stay within the safe range.

BRIEF DESCRIPTION OF THE DRAWINGS

Embodiments will be readily understood by the following detailed description in conjunction with the accompanying drawings. Embodiments are illustrated by way of example, and not by way of limitation, in the figures of the accompanying drawings.

DETAILED DESCRIPTION

Figure 1:
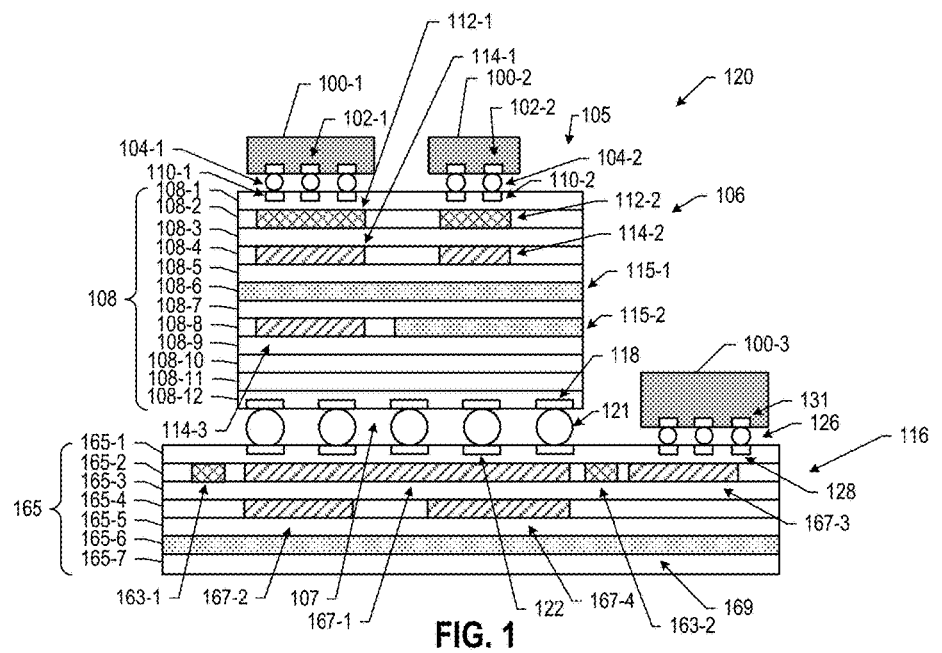
FIG. 1 is a side cross-sectional view of a printed circuit board (PCB) assembly for warpage mitigation, in accordance with various embodiments.

Disclosed herein are apparatus, systems, and methods for warpage mitigation in printed circuit board (PCB) assemblies. For example, in some embodiments, a PCB assembly for warpage mitigation may include: a PCB; and an interposer disposed on the PCB, wherein the interposer has a first face and an opposing second face, the first face is disposed between the second face and the PCB, conductive contacts are disposed at the second face, solder is disposed on the conductive contacts, the interposer includes a first heater trace proximate to the conductive contacts, and, when a first power is dissipated in the first heater trace, the first heater trace is to generate heat to cause the solder disposed on the conductive contacts to melt; wherein the PCB includes a second heater trace.

Thermal mismatch between materials used in PCBs can cause deformation of the PCB, resulting in stress to solder joints and complications during manufacturing and assembly (e.g., during package and component attach phases). Mechanical frames and clamps have conventionally been used to prevent warping in some PCBs (e.g., motherboards).

If a PCB assembly includes an interposer with heaters designed to cause local reflow of the solder attaching an integrated circuit (IC) package to the interposer (e.g., to facilitate the removal and reattachment of the IC package without the need for sockets or factory machinery), the PCB may be heated to an even greater degree than conventionally seen. This heating is likely to be nonuniform, with higher temperatures in the portions of the PCB closer to the interposer. The PCB warpage problem is thus amplified in such an assembly.

Various ones of the embodiments disclosed herein provide heater traces within a PCB to selectively heat portions of the PCB to maintain a uniform temperature profile across the PCB. This uniform temperature profile may result in uniform thermal expansion of the PCB, reducing the warpage risk and degree. The controlled heating provided by these heater traces may reduce the deformation of the PCB when a "heated" interposer is used, alleviating stress in solder joints and providing a flatter surface on which components (e.g., processing devices) may be attached. For example, heating the PCB near an attached component (e.g., a processing device or a heated interposer itself) may reduce the deformation experienced locally to that component.

The approach disclosed herein is contrary to the conventional wisdom that more heat in a PCB is to be avoided; instead, various ones of the embodiments disclosed herein increase the temperature of a PCB to improve reliability and performance. In some embodiments of the PCBs disclosed herein, no frames or clamps may be included. Moreover, as thinner PCBs are more likely to experience thermal warping, the techniques disclosed herein for warpage mitigation may enable the practical use of thinner PCBs than conventionally possible.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a side cross-sectional view of a PCB assembly 120 including IC packages 100-1 and 100-2 disposed on an interposer 106, and the interposer 106 and an IC package 100-3 disposed on a PCB 116, in accordance with various embodiments. The interposer 106 may include one or more heater traces 114, and the PCB 116 may include one or more heater traces 167. As discussed in detail below, the heater traces 114 of the interposer 106 may be used to facilitate a local reflow temperature for the attachment/detachment of the IC packages 100, while the heater traces 167 of the PCB 116 may be used to mitigate warpage caused by thermal mismatch between various components in the PCB assembly 120. In some embodiments, the PCB assembly 120 may include one or more heat spreaders, thermal interface material (TIM), or other thermal management components, such as a heat sink or a liquid cooling system (not shown). These thermal management components may be coupled to the IC package 100, the interposer 106, and/or the PCB 116.

The IC packages 100-1 and 100-2 may be ball grid array (BGA) packages and may include conductive contacts 102-1 and 102-2, respectively, that are coupled to conductive contacts 110-1 and 110-2 of the interposer 106 via solder 104-1 and 104-2, respectively. Each IC package 100 may include one or more IC dies (not shown) in electrical communication with the interposer 106 via the conductive contacts 102. The IC dies may have their own conductive contacts coupled to the conductive contacts 102 (e.g., via flip chip or wire bonding to an IC package substrate). An IC die included in an IC package 100 may include any suitable computing component, such as a central processing unit (CPU), graphics processing unit (GPU), any other processing device, a memory device, passive components, or any combination of computing components. For example, the IC package 100 may include any suitable ones of the components discussed below with reference to the computing device 500 of FIG. 8. In some embodiments, the IC packages 100 may include an underfill material, an overmold material, or may otherwise take the form of any IC packages known in the art.

The interposer 106 may include one or more heater traces 114. The heater traces 114 of the interposer 106 may be proximate to vias (not shown) coupled to the conductive contacts 110, and may be arranged such that, when power is selectively conducted through one or more of the heater traces 114, the heater traces 114 generate heat conducted by the vias to the conductive contacts 110 to cause the solder 104-1 or 104-2 disposed on the conductive contacts 110-1 or 110-2 to melt, enabling the attachment and/or detachment of the IC packages 100-1 or 100-2, respectively. Different ones of the heater traces 114 (e.g., the heater traces 114-1, 114-2, and 114-3) may be provided with power to heat different groupings of the conductive contacts 110 and melt solder 104 disposed thereon; for example, the heater traces 114 may generate heat to melt the solder 104-1 disposed on the conductive contacts 110-1, but not the solder 104-2 disposed on the conductive contacts 110-2, or vice versa.

The heat generated by the heater traces 114 may particularly heat vias (not shown for clarity of illustration, but discussed below) in the interposer 106 that couple to the conductive contacts 110, thereby heating the conductive contacts 110. In FIG. 1, the interposer 106 includes heater traces 114-1, 114-2, and 114-3, but the specific number of heater traces 114 shown in FIG. 1 is simply illustrative, and more or fewer heater traces 114 may be included in the interposer 106. Additionally, the specific arrangement of heater traces 114 shown in FIG. 1 is simply illustrative, and any suitable arrangement may be used. The amount of power provided to the heater traces 114 to melt the solder 104 on a particular set of conductive contacts 110 may depend on the particular temperature to be achieved to melt the solder 104 (which may depend on the solder material), the arrangement of the heater traces 114, and thermal constraints on other portions of the interposer 106 (e.g., other conductive contacts 110 having solder 104 that is not to be melted), for example.

In some embodiments, the interposer 106 may include one or more temperature sensor traces 112. In FIG. 1, for example, the interposer 106 includes temperature sensor traces 112-1 and 112-2. Each temperature sensor trace 112 may be formed of an electrically conductive material (e.g., a metal, such as copper) whose electrical resistance changes as a function of the equivalent temperature of the temperature sensor trace 112. As used herein, the "equivalent temperature" may represent a weighted average of the temperature of a temperature sensor trace 113; for example, if 90% of the length of a constant width temperature sensor trace 113 is 10° and the remaining 10% of the length of the temperature sensor trace 113 is 20°, the equivalent temperature for the temperature sensor trace 113 may be 11°. The function relating electrical resistance and equivalent temperature may be given by:

$$R = R\text{ref}\,(1+\alpha(T-T\text{ref}))$$

where R is the electrical resistance of the temperature sensor trace 112 at the equivalent temperature T, Rref is a reference electrical resistance of the temperature sensor trace 112 at a reference temperature Tref, and α is the temperature coefficient of resistance for the material forming the temperature sensor trace 112. The values of α, Rref, and Tref may be experimentally determined or may be known in the art, and are accordingly not discussed further herein. When α, Rref, and Tref are known for a particular temperature sensor trace 112, a measurement of the electrical resistance R of the temperature sensor trace 112 may enable the equivalent temperature T of the temperature sensor trace 112 to be determined in accordance with the above function. The values of α, Rref, and Tref may be stored in a memory device (e.g., in a lookup table) and may be accessed as desired. In some embodiments, functions other than the function given above may more accurately describe the relationship between electrical resistance R and equivalent temperature T of a temperature sensor trace 112 (e.g., as determined experimentally); in such embodiments, the parameters of the more accurate function may be stored in a memory device (e.g., in a lookup table) and used to determine the equivalent temperature T based on the electrical resistance R.

In some embodiments, the temperature data provided by the resistance of the temperature sensor traces 112 may be used by an interposer heater control device 130 (discussed below with reference to FIGS. 3-5) when providing power to the heater traces 114 in order to achieve particular temperatures at one or more locations in the interposer 106. For example, the temperature sensor traces 112 of the interposer 106 may be used to measure the equivalent temperature near the conductive contacts 110, and that temperature may be provided to a feedback loop in the interposer heater control device 130 to control the amount of power provided to the heater traces 114 to achieve a desired solder-melting temperature at the conductive contacts 110. The "amount" of power may be proportional to the duty cycle settings of a pulse width modulated (PWM) current or voltage signal, the RMS value of an AC current or voltage signal, a DC value of a current or voltage signal, or a combination thereof, for example.

The feedback loop may also be used to ensure that other portions of the interposer 106 do not exceed a maximum temperature and/or the temperature across the interposer 106 is relatively uniform to mitigate any mechanical failures that may occur as a result of thermal expansion mismatches. The specific number of temperature sensor traces 112 shown in FIG. 1 is simply illustrative, and more or fewer temperature sensor traces 112 may be included in the interposer 106. Additionally, the specific arrangement of temperature sensor traces 112 shown in FIG. 1 is simply illustrative, and any suitable arrangement may be used. In some embodiments, no temperature sensor traces 112 may be included in the interposer 106.

The interposer 106 may include multiple layers 108 (in particular, layers 108-1-108-12). One or more of these layers 108 may include one or more heater traces 114 and/or temperature sensor traces 112. For example, in the embodiment illustrated in FIG. 1, the layer 108-2 includes two temperature sensor traces 112-1 and 112-2, the layer 108-4 includes two heater traces 114-1 and 114-2, and the layer 108-8 includes a heater trace 114-3. Different layers including heater traces 114 and/or temperature sensor traces 112 may be spaced apart by insulator layers (e.g., the layers 108-3, 108-5, and 108-7 of FIG. 1). Some of the layers 108 may be metal layers that include signal routing traces, and some of the layers 108 may be insulator layers (e.g., formed of a dielectric material) that include vias to electrically couple different metal layers, as known in the art. For example, the layer 108-1 may be an insulator layer that includes vias (not shown) to route signals to/from the conductive contacts 110, and the layer 108-12 may be an insulator layer that includes vias (not shown) to route signals to/from the conductive contacts 118. Signal routing traces and vias are not shown in FIG. 1 for ease of illustration, and may be formed in accordance with any technique known in the art. In some embodiments, the interposer 106 may include multiple metal layers separated from one another by layers of dielectric material and interconnected by electrically conductive vias. Any one or more of the metal layers may be formed in a desired circuit pattern of signal routing traces to route electrical signals (optionally in conjunction with other metal layers) between the components of the interposer 106. In some embodiments, a layer 108 of the interposer 106 may include both signal routing traces and one or more heater traces 114 and/or temperature sensor traces 112. For example, the layers 108-2, 108-4, and/or 108-8 may include signal routing traces. In other embodiments, signal routing traces, heater traces 114, and/or temperature sensor traces 112 may be segregated in different layers 108.

In some embodiments, the interposer 106 may include one or more metal planes 115. For example, FIG. 1 illustrates a metal plane 115-1 that spans all of the layer 108-6, and a metal plane 115-2 that "shares" the layer 108-8 with the heater trace 114-3. The metal planes 115 included in the interposer 106 may act as heat spreaders and may help to achieve a uniform temperature profile across the interposer 106. As noted above, a uniform temperature profile may reduce the likelihood of cracking, delamination, or other mechanical failures that may arise as a result of mismatches in the coefficient of thermal expansion between different materials included in the PCB assembly 120. The metal planes 115 included in the interposer 106 may include holes (not shown) through which vias may extend (and from which the vias may be electrically insulated) as part of the signaling network in the interposer 106. The metal planes 115 may be distinguished from metal planes that are sometimes included in conventional PCBs for providing power or ground references; the metal planes 115 may not be conductively coupled to power or ground contacts of the interposer 106.

The interposer 106 may be formed of an epoxy resin, a fiberglass-reinforced epoxy resin, a ceramic material, or a polymer material such as polyimide. In some implementations, the interposer 106 may be formed of alternate rigid or flexible materials, such as silicon, germanium, and other group III-V and group IV materials. The interposer 106 may include metal interconnects and vias (not shown), including but not limited to through-silicon vias (TSVs). The interposer 106 may further include embedded devices (not shown), including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 106.

In some embodiments, the heater traces 114 and/or the temperature sensor traces 112 in the interposer 106 may have connection terminals (not shown) exposed at a surface of the interposer 106 at which an interposer heater control device 130 (discussed below with reference to FIGS. 3-5) may make electrical contact with the heater traces 114 (to provide power to the heater traces 114 to cause the heater traces 114 to generate heat) and/or with the temperature sensor traces 112 (to measure their electrical resistance and determine their equivalent temperatures). In some embodiments, the connection terminals of the temperature sensor traces 112 and the heater traces 114 may be coupled to the conductive contacts 118, and the interposer heater control device 130 may be coupled to the PCB 116.

The interposer 106 may include conductive contacts 118 disposed at a first face 107 of the interposer 106, and the conductive contacts 110 may be disposed at a second face 105 of the interposer. The conductive contacts 118 may be coupled to conductive contacts 122 of the PCB 116 via solder 121. Additional IC packages, such as the IC package 100-3 of FIG. 1, may be coupled to the PCB 116. The IC package 100-3 may take the form of any of the IC packages 100 disclosed herein and may include conductive contacts 131 coupled to conductive contacts 128 of the PCB 116 via solder 126. In some embodiments, the PCB 116 may be a motherboard or other suitable substrate.

Figure 2:
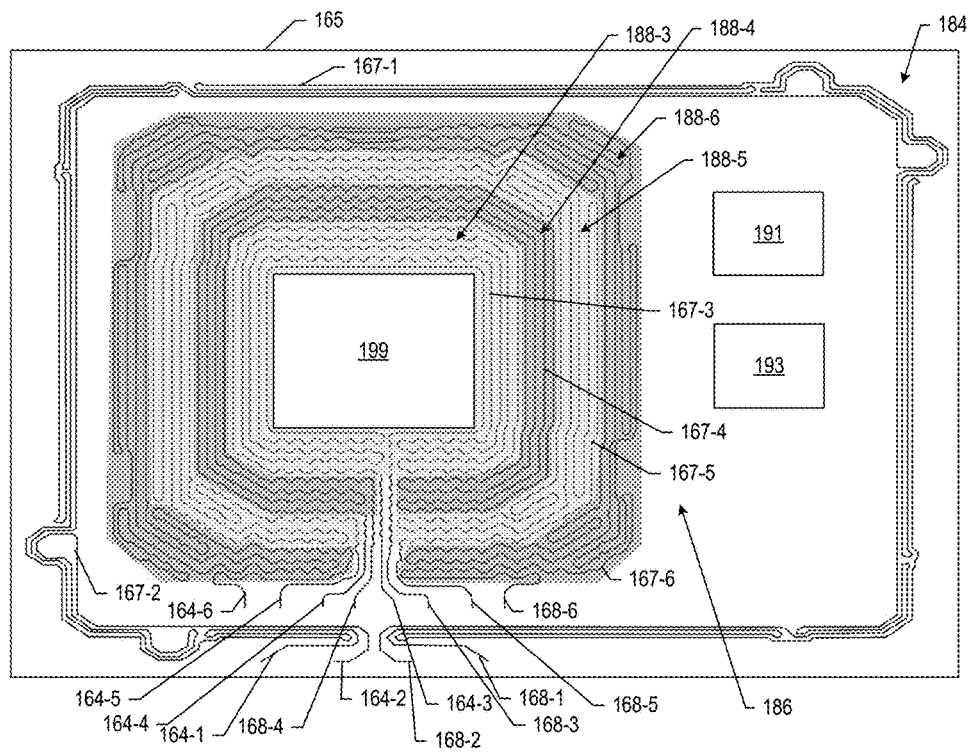
FIG. 2 is a top view of an example of multiple heater traces for warpage mitigation in a PCB, in accordance with various embodiments.

The PCB 116 may include one or more heater traces 167. The heater traces 167 of the PCB 116 may be arranged such that, when power is selectively dissipated in one or more of the heater traces 114 to facilitate local reflow of the solder 104, power is selectively dissipated in one or more of the heater traces 167 to cause the heater traces 167 to generate heat to mitigate deformation of the PCB 116 caused by the heat generated by the heater traces 114. Different ones of the heater traces 167 (e.g., the heater traces 167-1, 167-2, 167-3, and 167-4) may be provided with power to generate heat in different regions of the PCB 116 in order to achieve a uniform temperature profile in the PCB 116. An example of an arrangement of multiple heater traces 167 in the PCB 116 is discussed below with reference to FIG. 2. The specific arrangements of heater traces 167 shown in FIGS. 1 and 2 are simply illustrative, and any suitable arrangement may be used. The amount of power provided to the heater traces 167 may depend on the particular temperature to be achieved, the materials used in the PCB 116, the geometry of the PCB 116, and thermal constraints on other portions of the PCB 116 (e.g., conductive contacts 122 and 128 having solder thereon that is not to be melted), for example.

In some embodiments, the PCB 116 may include one or more temperature sensor traces 163 (e.g., the temperature sensor traces 163-1 and 163-2 illustrated in FIG. 1). The temperature sensor traces 163 may take the form of any of the embodiments of the temperature sensor traces 112 discussed above with reference to the interposer 106. In some embodiments, the temperature data provided by the resistance of the temperature sensor traces 163 may be used by a PCB heater control device 137 (discussed below with reference to FIG. 5) when providing power to the heater traces 167 in order to achieve particular temperatures at one or more locations in the PCB 116. For example, the temperature sensor traces 163 of the PCB 116 may be used to measure the equivalent temperature near the heater traces 167, and that temperature may be provided to a feedback loop in the PCB heater control device 137 to control the amount of provided to the heater traces 167 to achieve a desired temperature proximate to the heater traces 167. The "amount" of power may be the duty cycle settings of a pulse width modulated (PWM) voltage or current signal, the AC RMS or DC value of a voltage or current signal, or a combination thereof, for example.

The feedback loop may also be used to ensure that other portions of the PCB 116 do not exceed a maximum temperature and/or the temperature across the PCB 116 is relatively uniform to mitigate any mechanical failures that may occur as a result of thermal expansion mismatches. The specific number of temperature sensor traces 163 shown in FIG. 1 is simply illustrative, and more or fewer temperature sensor traces 163 may be included in the PCB 116. Additionally, the specific arrangement of temperature sensor traces 163 shown in FIG. 1 is simply illustrative, and any suitable arrangement may be used. In some embodiments, no temperature sensor traces 163 may be included in the PCB 116.

The PCB 116 may include multiple layers 165 (in particular, layers 165-1-165-7). One or more of these layers 165 may include one or more heater traces 167 and/or temperature sensor traces 163. For example, in the embodiment illustrated in FIG. 1, the layer 165-2 includes two temperature sensor traces 163-1 and 163-2 and two heater traces 167-1 and 167-3, and the layer 165-4 includes two heater traces 167-2 and 167-4. Different layers including heater traces 167 and/or temperature sensor traces 163 may be spaced apart by insulator layers (e.g., the layer 165-3 of FIG. 1). Some of the layers 165 may be metal layers that include signal routing traces, and some of the layers 165 may be insulator layers (e.g., formed of a dielectric material) that include vias to electrically couple different metal layers, as known in the art. For example, the layer 165-1 may be an insulator layer that includes vias (not shown) to route signals to/from the conductive contacts 122 and the conductive contacts 128. Signal routing traces and vias are not shown in FIG. 1 for ease of illustration, and may be formed in accordance with any technique known in the art. In some embodiments, the PCB 116 may include multiple metal layers separated from one another by layers of dielectric material and interconnected by electrically conductive vias. Any one or more of the metal layers may be formed in a desired circuit pattern of signal routing traces to route electrical signals (optionally in conjunction with other metal layers) between the components of the PCB 116. In some embodiments, a layer 165 of the PCB 116 may include signal routing traces and one or more heater traces 167 and/or temperature sensor traces 163. For example, the layers 165-2 and 165-4 may include signal routing traces. In other embodiments, signal routing traces, heater traces 167, and/or temperature sensor traces 163 may be segregated in different layers 165.

In some embodiments, the PCB 116 may include one or more metal planes 169. For example, FIG. 1 illustrates a metal plane 169 that spans all of the layer 165-6, but metal planes 169 may "share" a layer 165 with heater traces 167 and/or temperature sensor traces 163. As discussed above with reference to the metal planes 115 of the interposer 106, the metal planes 169 included in the PCB 116 may act as heat spreaders and may help to achieve a uniform temperature profile across the PCB 116. As noted above, a uniform temperature profile may reduce the likelihood of cracking, delamination, or other mechanical failures that may arise as a result of mismatches in the coefficient of thermal expansion between different materials included in the PCB assembly 120. The metal planes 169 included in the PCB 116 may include holes (not shown) through which vias may extend (and from which the vias may be electrically insulated) as part of the electrical signaling network in the PCB 116. The metal planes 169 may be distinguished from metal planes that are sometimes included in conventional PCBs for providing power or ground references; the metal planes 169 may not be conductively coupled to power or ground contacts of the PCB 116.

In some embodiments, the heater traces 167 and/or the temperature sensor traces 163 in the PCB 116 may have connection terminals (not shown in FIG. 1, but discussed below with reference to FIG. 2) exposed at a surface of the PCB 116 at which a PCB heater control device 137 (discussed below with reference to FIG. 5) may make electrical contact with the heater traces 167 (to provide power to the heater traces 167 to cause the heater traces 167 to generate heat) and/or with the temperature sensor traces 163 (to measure their electrical resistance and determine their equivalent temperatures). For example, the connection terminals of the temperature sensor traces 163 and the heater traces 167 may be coupled to the conductive contacts 128, and the PCB heater control device 137 may be included in the IC package 100-3. In some embodiments, the connection terminals of the temperature sensor traces 163 and the heater traces 167 may be coupled to the conductive contacts 122, and the PCB heater control device 137 may be coupled to or included in the interposer 106. In some embodiments, as discussed below, the PCB heater control device 137 and the interposer heater control device 130 may be part of a common heater control device (which may, in some embodiments, take the form of the modular interposer heater control device 130 discussed above).

A heater trace 167 included in the PCB 116 of the PCB assembly 120 may be arranged in any desired pattern. For example, FIG. 2 is a top view of an example of multiple heater traces 167 in a layer 165 of a PCB 116, in accordance with various embodiments. In particular, each of the heater traces 167-1, 167-2, 167-3, 167-4, 167-5, and 167-6 may be arranged to heat a different region of the layer 109. For example, the heater traces 167-1 and 167-2 may be arranged largely proximate to the corners and edges of the layer 165 in a perimeter region 184 of the layer 165, while the heater traces 167-3, 167-4, 167-5, and 167-6 may be disposed in a central region 186 of the layer 109. In the embodiment illustrated in FIG. 2, the heater traces 167-3, 167-4, 167-5, and 167-6 may be arranged concentrically around a footprint 199 of the interposer 106 (disposed in the central region 186). The heater traces 167-3, 167-4, 167-5, and 167-6 may be provided with power to selectively heat the PCB 116 around the interposer 106, for example, in order to mitigate any warpage that may be caused by the heat generated by the heater traces 114 of the interposer 106 when an IC package 100 is being attached or detached from the interposer 106 (e.g., as discussed below with reference to FIGS. 3 and 4).

Each of the heater traces 167 in the embodiment of FIG. 2 may include a first connection terminal 164 and a second connection terminal 168. These connection terminals are shown as the ends of the heater traces 167, which may be coupled to pads disposed on the PCB 116 or to another suitable component. A PCB heater control device 137 (not shown in FIG. 2, but, e.g., as discussed below with reference to FIG. 5) may be coupled to the connection terminals 164 and 168 of a heater trace 167 and may provide power to the connection terminals 164 and 168 to cause the heater trace 167 to generate heat. Independently or jointly controlling each of the heater traces 167 in the embodiment of FIG. 2 may enable the mitigation of thermal gradients in the PCB 116, thereby controlling the temperature profile of the PCB 116 with high resolution.

Each of the heater traces 167 illustrated in the embodiment of FIG. 2 may have a footprint 188. In FIG. 2, only the footprints 188-3, 188-4, 188-5, and 188-6 are labeled for ease of illustration, and are indicated by shading. Connection terminal extensions of each heater trace 167 may extend away from the footprint 188 to provide the connection terminals 164 and 168 (where the heater trace 167 may be coupled with a power source, such as the interposer heater control device 130). In the embodiment illustrated in FIG. 2, the heater traces 167-3, 167-4, 167-5, and 167-6 each extend around the footprint 199 of the interposer 106 in a concentric manner, enabling the temperature gradient of the PCB 116 around the interposer 106 to be controlled by controlling the heat delivered by each of the heater traces 167-3, 167-4, 167-5, and 167-6.

In some embodiments, the PCB 116 may include additional heater traces like the heater traces 114 included in the interposer 106; these heater traces may be arranged and used to selectively reflow solder on conductive contacts of the PCB 116 in the same manner that the heater traces 114 are arranged and used to selectively reflow the solder 104 on the conductive contacts 110. For example, such traces may be disposed in the areas 191 and 193 of the layer 165 of FIG. 2, and may take the form of any of the embodiments discussed above with reference to the heater traces 114. Components attached to the PCB 116 in the areas 191 and 193 may be readily detached and reattached as discussed herein with reference to FIGS. 3 and 4, eliminating the need to perform repairs on surface-mounted components in the factory with a rework machine (and reducing the likelihood that the PCB 116 will be thrown away). Just as the heater traces 167 may be used to generate heat to mitigate warpage induced by heat generated by the heater traces 114, the heater traces 167 may be used to generate heat to mitigate warpage induced by these additional heater traces in the PCB 116. Power may be provided to these additional heater traces by a dedicated heater control device (e.g., in accordance with any of the embodiments of the interposer heater control device 130) or by the PCB heater control device 137.

Figure 3:
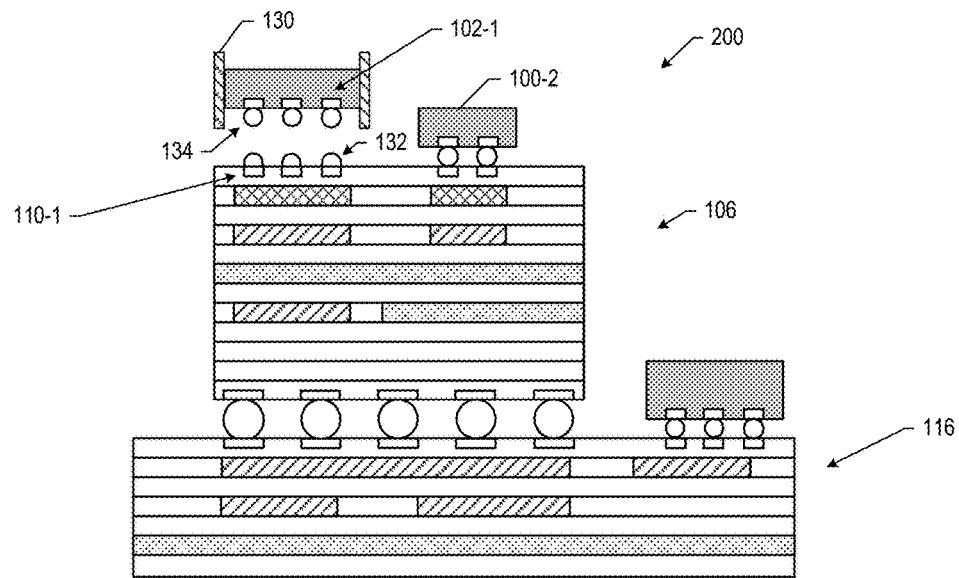
FIG. 3 is a side cross-sectional view of an assembly subsequent to bringing an interposer heater control device and an integrated circuit (IC) package in proximity to the interposer of FIG. 1, in accordance with various embodiments.

As noted above, the heater traces 114 included in the interposer 106 may be used to facilitate the attachment and detachment of one or more of the IC packages 100 from the interposer 106. FIG. 3 is a side cross-sectional view of an assembly 200 subsequent to bringing an interposer heater control device 130 and an IC package 100-1 in proximity to the interposer 106 (coupled to the PCB 116) of FIG. 1, in accordance with various embodiments. In some embodiments, the interposer heater control device 130 may include a mechanical clamp or other structure to hold the IC package 100-1, and may also include alignment features (e.g., alignment corners, pins) to facilitate the alignment of the interposer heater control device 130 (while holding the IC package 100-1) into a desired position on the interposer 106. Solder balls 134 may be disposed on the conductive contacts 102-1 of the IC package 100-1, and solder paste 132 may be disposed on the conductive contacts 110-1. Proper alignment of the interposer heater control device 130 (and IC package 100-1) with the interposer 106 may align the conductive contacts 102-1 with corresponding conductive contacts 110-1, may align heater trace contacts (not shown) of the interposer heater control device 130 with connection terminals (not shown) of the heater traces 114, and may align temperature sensor trace contacts (not shown) of the interposer heater control device 130 with connection terminals (not shown) of the temperature sensor traces 112.

Figure 4:
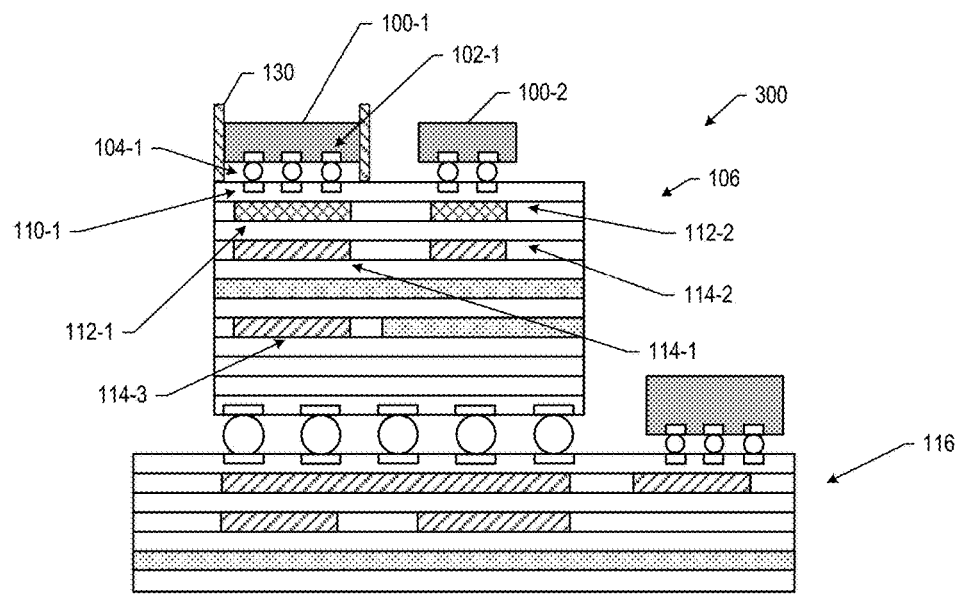
FIG. 4 is a side cross-sectional view of an assembly subsequent to using the interposer heater control device of FIG. 3 to couple the IC package to the interposer, in accordance with various embodiments.

FIG. 4 is a side cross-sectional view of an assembly 300 subsequent to using the interposer heater control device 130 of FIG. 3 to couple the IC package 100-1 to the interposer 106, in accordance with various embodiments. In particular, once the interposer heater control device 130 and the IC package 100-1 are properly aligned with the interposer 106, the interposer heater control device 130 may apply power to the heater traces 114 of the interposer 106 to melt the solder balls 134 and the solder paste 132 to conductively couple the conductive contacts 102-1 of the IC package 100-1 to the conductive contacts 110-1 of the interposer 106. As discussed above, in some embodiments, the interposer heater control device 130 may use temperature feedback from the temperature sensor traces 112 to adjust the amount of power provided to the heater traces 114 to achieve a desired temperature profile in the interposer 106. Once the solder balls 134 and the solder paste 132 have achieved desired reflow conditions, the interposer heater control device 130 may allow the heater traces 114 to cool, thereby allowing the newly formed solder connections 104 between the conductive contacts 102-1 and the conductive contacts 110-1 to solidify. The interposer heater control device 130 may then disengage from the IC package 100-1 and the interposer 106.

If the IC package 100-1 is to be detached from the interposer 106, an analogous procedure may be performed: the interposer heater control device 130 may be brought into alignment with the IC package 100-1 and the interposer 106, power may be selectively provided to the heater traces 114 to cause the solder 104-1 to melt, and the IC package 100-1 may be removed.

In some embodiments, the interposer heater control device 130 may be temporarily coupled to the IC package 100-1, and may be disengaged from the IC package 100-1 when attachment/detachment of the IC package 100-1 is not under way. For example, the interposer heater control device 130 may be a reusable, modular device that can be used in the field or in a factory setting. Such an interposer heater control device 130 may be designed for use with one particular IC package design or may be usable with multiple different IC package designs. In other embodiments, the interposer heater control device 130 may be permanently coupled to the IC package 100-1. In some embodiments, the interposer heater control device 130 may be temporarily coupled to the interposer 106 and may be disengaged from the interposer 106 when attachment/detachment of the IC package 100-1 is not under way. In other embodiments, the interposer heater control device 130 may be permanently coupled to the interposer 106.

By facilitating the attachment/detachment of the IC package 100-1, the interposer 106 may improve on conventional attachment methodologies. Such conventional attachment methodologies include conventional BGA attachment, in which an IC package is soldered to a component. Conventional BGA attachment typically exhibits high reliability and good high-speed signaling performance, but must be reworked in a controlled factory setting with specialized equipment and training, and therefore BGA packages are not readily attached and detached during testing or in the field. Another example of a conventional attachment methodology is a land grid array (LGA), in which an IC package is fitted into a socket. IC packages with LGA connections are readily attached and detached, but LGA sockets are prone to damage (and are themselves not readily replaced) and may exhibit poor high-speed signal performance (e.g., by adding impedance and cross talk to the signal chain). Another example of a conventional attachment methodology is metal particle interconnect (MPI), another socket methodology. Conventional MPI sockets are too expensive to be suited for high-volume production, and may add impedance to the signal chain.

The interposer 106 may provide the advantages of conventional BGA attachment by facilitating a direct solder connection between the interposer 106 and the IC package 100-1, while facilitating easy attachment/detachment by the use of the heater traces 114 (achieving or surpassing the ease of sockets). When the interposer heater control device 130 is a modular component, a technician in the factory or field can readily install or replace the IC package 100-1.

In some embodiments, the PCB heater control device 137 may be included in a common housing with the interposer heater control device 130. When the interposer heater control device 130 is being used to attach/detach the IC package 100-1 from the interposer 106, the PCB heater control device 137 may make electrical contact with the heater traces 167 and/or the temperature sensor traces 163 to simultaneously generate heat in the PCB 116. The heat generated in the PCB 116 may help maintain a uniform temperature profile across the PCB 116 and reduce the likelihood of thermal deformation within the PCB 116 and/or between the PCB 116 and the interposer 106. In other embodiments, the PCB heater control device 137 may be separate from the interposer heater control device 130. For example, as discussed above, the PCB heater control device 137 may be coupled to the PCB 116 (e.g., in the IC package 100-3). The PCB heater control device 137 may be separately actuated (e.g., manually by a technician operating the interposer heater control device 130) or may automatically cause power to be selectively provided to the heater traces 167 (e.g., in response to sensing an elevated temperature caused by heat generated by the heater traces 114 of the interposer 106). In some embodiments, the interposer heater control device 130 may include its own power source to drive the heater traces 114, while in other embodiments, the interposer heater control device 130 may utilize a power source included in the interposer 106 or the PCB 116.

Without the uniform temperature profile created by the heat generated by the heater traces 167, performing a local reflow of the solder 104 using the interposer 106 may cause local warming of the PCB 116 in the area proximate to the interposer 106. The warmed area of the PCB 116 may expand, possibly causing the PCB 116 to "bow" or otherwise deform. This deformation may stress the solder 121 between the PCB 116 and the interposer 106, causing the solder 121 to crack or entirely conductively decouple. The connection between the PCB 116 and components disposed on the PCB 116 (e.g., the package 100-1) may similarly be adversely affected by the thermal warping of the PCB 116. However, the use of the heater traces 167 may mitigate thermal warpage by heating otherwise "cool" areas of the PCB 116 to achieve a uniform temperature profile.

Figure 5:
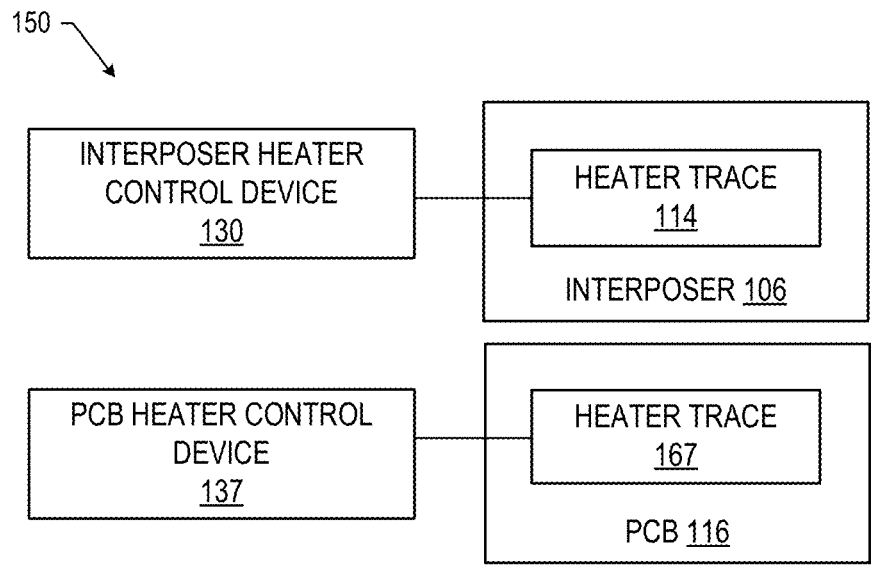
FIG. 5 is a block diagram of a warpage mitigation system, in accordance with various embodiments.

As discussed above, the heater traces 167 of the PCB 116 may be used in a warpage mitigation system to control the temperature profile of the PCB 116 to mitigate deformation and improve performance of the PCB assembly 120. FIG. 5 is a block diagram of a warpage mitigation system 150, in accordance with various embodiments. The system 150 may include one or more heater traces 167 of the PCB 116, and one or more heater traces 114 of the interposer 106. An interposer heater control device 130 may be coupled to the heater trace 114 (to control power provided to the heater trace 114) and a PCB heater control device 137 may be coupled to the heater trace 167 (to control power provided to the heater trace 167). In particular, when the interposer heater control device 130 provides power to the heater trace 114 to cause local reflow of the solder 104 (as discussed above with reference to FIGS. 1 and 3-4), the PCB heater control device 137 may as well provide power to the heater trace 167 to cause local heating in the PCB 116 to counteract thermal warpage that may occur as a result of the heat generated by the heater trace 114.

In some embodiments, the PCB heater control device 137 may operate independently of the interposer heater control device 130, and may cause the heater traces 167 to heat in response to any thermal gradient or other undesired thermal conditions sensed by the PCB heater control device 137 (e.g., via one or more temperature sensor traces 163). As discussed above, in some embodiments, the interposer heater control device 130 and the PCB heater control device 137 may be included in a common housing, while in other embodiments, the interposer heater control device 130 and the PCB heater control device 137 may be physically separate. The interposer heater control device 130 and/or the PCB heater control device 137 may be implemented using any controller device and technique known in the art (e.g., a microcontroller configured with feedback).

In some embodiments, the system 150 may further include one or more temperature sensor traces 163 (not shown in FIG. 5) of the PCB 116, coupled to the PCB heater control device 137. In such embodiments, the PCB heater control device 137 may be configured to measure the resistance of the temperature sensor trace 163 and thereby determine the equivalent temperature of the temperature sensor trace 163, as discussed above. The PCB heater control device 137 may then control the power provided to the heater traces 167 based on the equivalent temperature (e.g., increasing the power when the equivalent temperature is below a desired temperature, and vice versa). Similarly, the system 150 may further include one or more temperature sensor traces 112 (not shown in FIG. 5) of the interposer 106, coupled to the interposer heater control device 130. In such embodiments, the interposer heater control device 130 may be configured to measure the resistance of the temperature sensor trace 112 and thereby determine the equivalent temperature of the temperature sensor trace 112, discussed above. The interposer heater control device 130 may then control the power provided to the heater traces 114 based on the equivalent temperature (e.g., increasing the power when the equivalent temperature is below a desired reflow temperature, and vice versa). The heater traces 167 and the PCB heater control device 137 may be configured to limit the heat generated by the heater traces 167 to avoid accidentally reflowing any solder coupled to conductive contacts of the PCB 116 (e.g., the solder 121 disposed on the conductive contacts 122), or otherwise exceeding any thermal constraints in the PCB 116.

Figure 6:
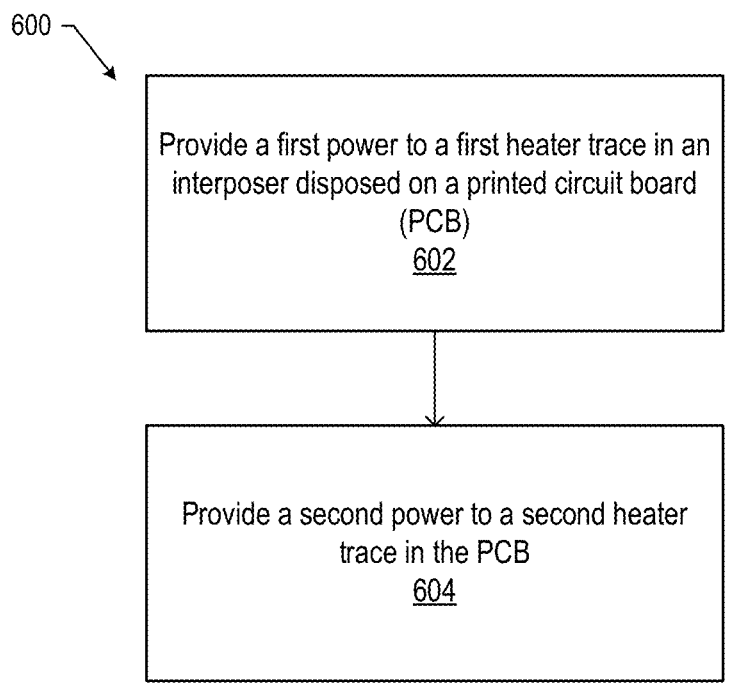
FIG. 6 is a flow diagram of a method of mitigating warpage in a PCB assembly, in accordance with various embodiments.

FIG. 6 is a flow diagram of a method 600 of mitigating warpage in a PCB assembly, in accordance with various embodiments. While the operations of the method 600 are arranged in a particular order in FIG. 6 and illustrated once each, in various embodiments, one or more of the operations may be repeated or performed in parallel (e.g., when the PCB of the method 600 is being heated simultaneously with heating of the interposer of the method 600). Operations discussed below with reference to the method 600 may be illustrated with reference to the IC assembly 120 and the warpage mitigation system 150 of FIG. 5, but this is simply for ease of discussion, and the method 600 may be used to mitigate warpage in any suitable PCB.

At 602, a first power may be provided to a first heater trace in an interposer disposed on a PCB in a PCB assembly. For example, a first power may be provided to the heater trace 114-1 in the interposer 106 disposed on the PCB 116 in the PCB assembly 120 of FIG. 1. In some embodiments, the first power may be provided by the interposer heater control device 130.

At 604, a second power may be provided to a second heater trace in the PCB. For example, a second power may be provided to the heater trace 167-1 in the PCB 116 of the PCB assembly 120 of FIG. 1. In some embodiments, the second power may be provided by the PCB heater control device 137. As noted above, in some embodiments, the interposer heater control device 130 and the PCB heater control device 137 may be included in a common housing.

In some embodiments, as discussed above, the amount of the first power provided at 602 and/or the amount of the second power provided at 604 may be determined based on temperature measurements in the interposer and/or the PCB, respectively (e.g., in order to achieve a desired temperature).

Figure 7:
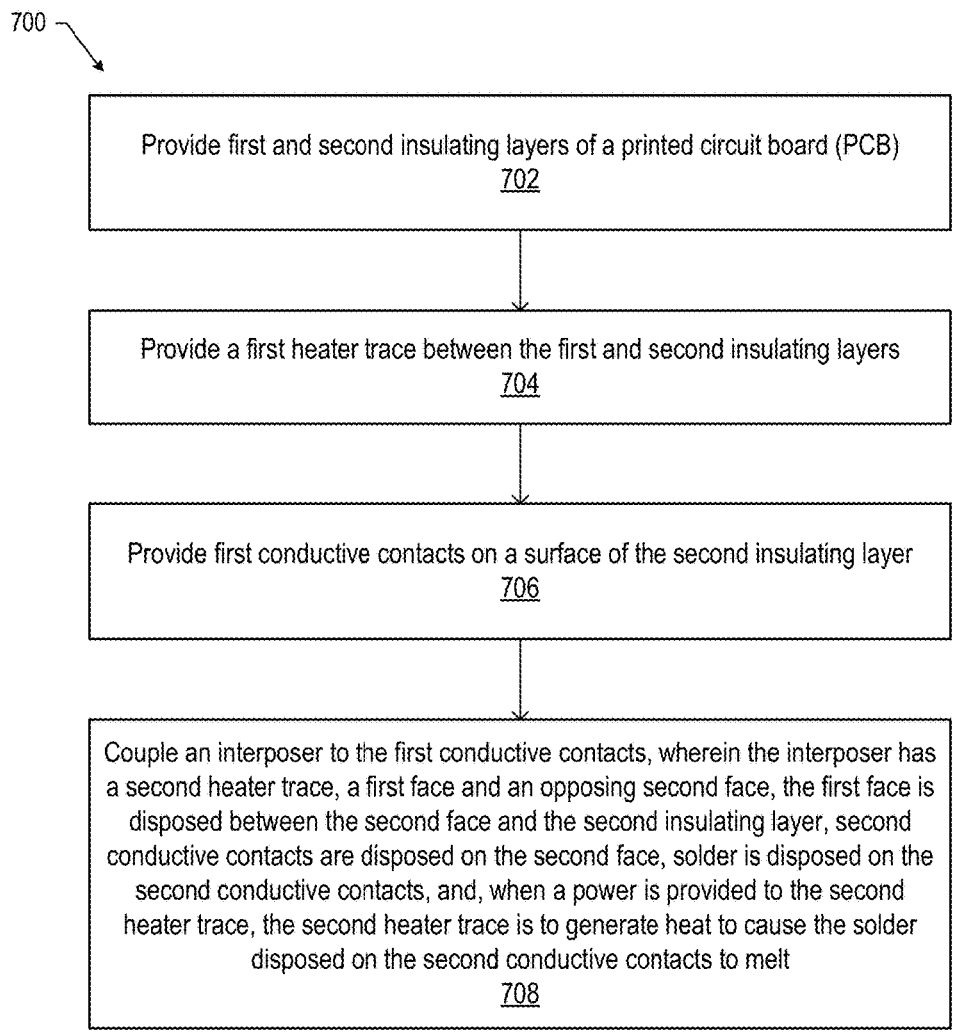
FIG. 7 is a flow diagram of a method of manufacturing a PCB assembly for warpage mitigation, in accordance with various embodiments.

FIG. 7 is a flow diagram of a method 700 of manufacturing a PCB assembly for warpage mitigation, in accordance with various embodiments. While the operations of the method 700 are arranged in a particular order in FIG. 7 and illustrated once each, in various embodiments, one or more of the operations may be repeated or performed in parallel (e.g., when multiple PCB assemblies are being manufactured). Operations discussed below with reference to the method 700 may be illustrated with reference to the PCB assembly 120 of FIG. 1, but this is simply for ease of discussion, and the method 700 may be used to manufacture any suitable PCB assembly.

At 702, first and second insulating layers of a PCB may be provided. For example, the insulating layer 165-1 and the insulating layer 165-7 of the PCB 116 may be provided as part of a PCB manufacturing procedure, as known in the art.

At 704, a first heater trace may be provided between the first and second insulating layers of the PCB. For example, a first heater trace 167 (e.g., any of the heater traces 167-1, 167-2, 167-3, and 167-4 of FIG. 1) may be provided between the insulating layer 165-1 and the insulating layer 165-7 of the PCB 116. The operations discussed above with reference to 702 and 704 may be performed as part of a PCB manufacturing procedure wherein different layers of the PCB are formed in sequence. In particular, the provision of the first and second insulating layers at 702 may not occur before the provision of the heater trace at 704; instead, one of the insulating layers may be provided, the heater trace may be subsequently provided, and the other of the insulating layers may be subsequently provided.

At 706, first conductive contacts may be provided on a surface of the second insulating layer. For example, the conductive contacts 122 may be provided on the insulating layer 165-1.

At 708, an interposer may be coupled to the conductive contacts of 706. The interposer may have a second heater face, a first face and an opposing second face, the first face may be disposed between the second face and the second insulating layer, second conductive contacts may be disposed on the second face, solder may be disposed on the second conductive contacts, and, when power is provided to the second heater trace, the second heater trace may generate heat to cause the solder disposed on the second conductive contacts to melt. For example, the interposer 106 may have a heater trace 114, a first face 107 and an opposing second face 105, the first face 107 may be disposed between the second face 105 and the insulating layer 165-1 of the PCB 116, conductive contacts 110 may be disposed on the second face 105, solder 104 may be disposed on the conductive contacts 110, and, when power is provided to the heater trace 114 (e.g., the heater trace 114-1, 114-2, or 114-3), the heater trace 114 is to generate heat to cause the solder 104 disposed on the conductive contacts 110 to melt.

In some embodiments, the method 700 may further specify that, when the interposer is coupled to the first conductive contacts via solder joints, and when power is dissipated in the first heater trace to mitigate warpage caused by the heat generated by the second heater trace, the heat generated by the first heater trace does not melt the solder joints. For example, when the interposer 106 is coupled to the first conductive contacts 122 via solder 121, and when a first power is dissipated in a heater trace 167 in the PCB 116 to mitigate warpage caused by the heat generated by the heater trace 114, the heat generated by the heater trace 167 does not melt the solder 121. The heater traces 167 may thus mitigate warpage without causing the interposer 106 to conductively decouple from the PCB 116.

Figure 8:
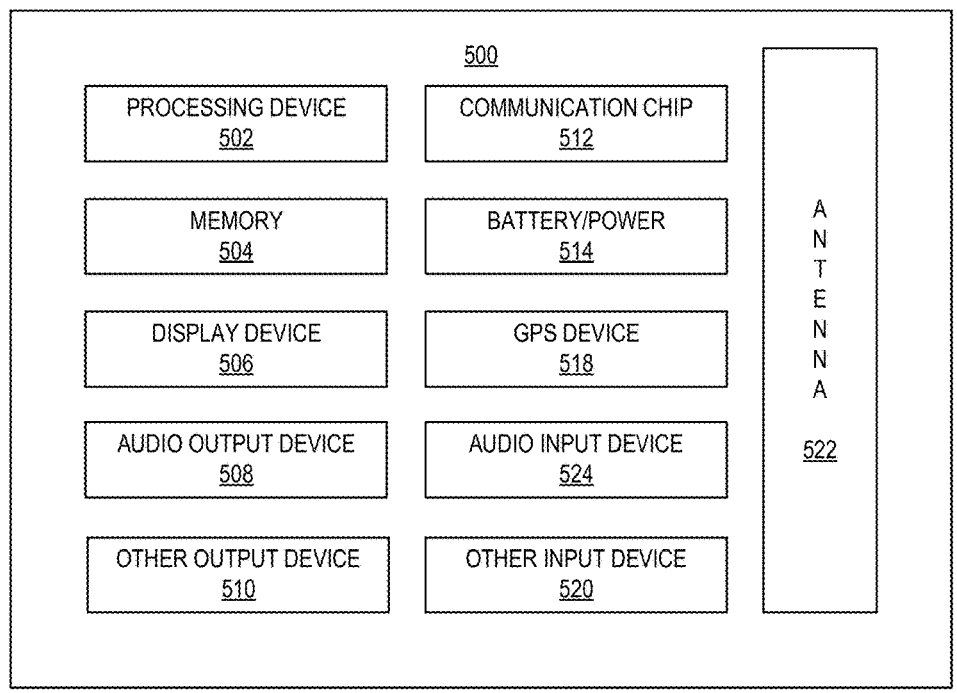
FIG. 8 is a block diagram of an example computing device that may include a PCB assembly for warpage mitigation in accordance with the teachings of the present disclosure.

FIG. 8 is a block diagram of an example computing device 500 that may include a PCB assembly 120 in accordance with the teachings of the present disclosure. In particular, any of the components of the computing device 500 that may be implemented at least partially in an IC package may include the IC package 100 and may be included in the PCB assembly 120. Alternatively or additionally, any of the components of the computing device 500 that may be secured to a PCB may be secured to the PCB 116. A number of components are illustrated in FIG. 8 as included in the computing device 500, but any one or more of these components may be omitted or duplicated, as suitable for the application. In some embodiments, some or all of these components are fabricated onto a single system-on-a-chip (SoC) die (e.g., included in an IC package 100).

Additionally, in various embodiments, the computing device 500 may not include one or more of the components illustrated in FIG. 8, but the computing device 500 may include interface circuitry for coupling to the one or more components. For example, the computing device 500 may not include a display device 506, but may include display device interface circuitry (e.g., a connector and driver circuitry) to which a display device 506 may be coupled. In another set of examples, the computing device 500 may not include an audio input device 524 or an audio output device 508, but may include audio input or output device interface circuitry (e.g., connectors and supporting circuitry) to which an audio input device 524 or audio output device 508 may be coupled. Any one or more of the components of the computing device 500 may include one or more PCB assemblies 120.

The computing device 500 may include a processing device 502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 502 may be included in the PCB assembly 120 (e.g., in an IC package 100). The computing device 500 may include a memory 504, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 504 may include memory that shares a die with the processing device 502. This memory may be used as cache memory and may include embedded DRAM (eDRAM) or spin transfer torque magnetic RAM (STT-MRAM). The memory 504 may be included in a PCB assembly 120 (e.g., secured to the PCB 116).

In some embodiments, the computing device 500 may include a communication chip 512 (e.g., one or more communication chips). For example, the communication chip 512 may be configured for managing wireless communications for the transfer of data to and from the computing device 500. The term "wireless" and its derivatives may be used to describe circuits, devices, systems, methods, techniques, communication channels, etc., that may communicate data through the use of modulated electromagnetic radiation through a nonsolid medium. The term does not imply that the associated devices do not contain any wires, although in some embodiments they might not. The communication chip 512 may be included in the PCB assembly 120.

The communication chip 512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 512 may operate in accordance with other wireless protocols in other embodiments. The computing device 500 may include an antenna 522 to facilitate wireless communications and/or to receive other wireless communications (such as AM or FM radio transmissions).

In some embodiments, the communication chip 512 may manage wired communications, such as electrical, optical, or any other suitable communication protocols (e.g., the Ethernet). As noted above, the communication chip 512 may include multiple communication chips. For instance, a first communication chip 512 may be dedicated to shorter-range wireless communications such as Wi-Fi or Bluetooth, and a second communication chip 512 may be dedicated to longer-range wireless communications such as GPS, EDGE, GPRS, CDMA, WiMAX, LTE, EV-DO, or others. In some embodiments, a first communication chip 512 may be dedicated to wireless communications, and a second communication chip 512 may be dedicated to wired communications.

The computing device 500 may include battery/power circuitry 514. The battery/power circuitry 514 may include one or more energy storage devices (e.g., batteries or capacitors) and/or circuitry for coupling components of the computing device 500 to an energy source separate from the computing device 500 (e.g., AC line power). Some or all of the battery/power circuitry 514 may be secured to the PCB 116, as noted above.

The computing device 500 may include a display device 506 (or corresponding interface circuitry, as discussed above). The display device 506 may include any visual indicators, such as a heads-up display, a computer monitor, a projector, a touchscreen display, a liquid crystal display (LCD), a light-emitting diode display, or a flat panel display, for example.

The computing device 500 may include an audio output device 508 (or corresponding interface circuitry, as discussed above). The audio output device 508 may include any device that generates an audible indicator, such as speakers, headsets, or earbuds, for example.

The computing device 500 may include an audio input device 524 (or corresponding interface circuitry, as discussed above). The audio input device 524 may include any device that generates a signal representative of a sound, such as microphones, microphone arrays, or digital instruments (e.g., instruments having a musical instrument digital interface (MIDI) output).

The computing device 500 may include a global positioning system (GPS) device 518 (or corresponding interface circuitry, as discussed above). The GPS device 518 may be in communication with a satellite-based system and may receive a location of the computing device 500, as known in the art. Some or all of the GPS device 518 may be secured to the PCB 116, as noted above.

The computing device 500 may include an other output device 510 (or corresponding interface circuitry, as discussed above). Examples of the other output device 510 may include an audio codec, a video codec, a printer, a wired or wireless transmitter for providing information to other devices, or an additional storage device.

The computing device 500 may include an other input device 520 (or corresponding interface circuitry, as discussed above). Examples of the other input device 520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 500 may be any other electronic device that processes data.

The following paragraphs provide various examples of the embodiments disclosed herein.

Example 1 is a printed circuit board (PCB) assembly for warpage mitigation, including: a PCB; and an interposer disposed on the PCB, wherein the interposer has a first face and an opposing second face, the first face is disposed between the second face and the PCB, conductive contacts are disposed at the second face, solder is disposed on the conductive contacts, the interposer includes a first heater trace proximate to the conductive contacts, and, when a first power is dissipated in the first heater trace, the first heater trace is to generate heat to cause the solder disposed on the conductive contacts to melt; wherein the PCB includes a second heater trace.

Example 2 may include the subject matter of Example 1, and may further specify that, when a second power is dissipated in the second heater trace, the second heater trace is to generate heat to mitigate deformation of the PCB caused by heat generated by the first heater trace.

Example 3 may include the subject matter of Example 2, and may further specify that the interposer is coupled to the PCB via solder joints, and when the second power is dissipated in the second heater trace, the heat generated by the second heater trace does not melt the solder joints.

Example 4 may include the subject matter of any of Examples 1-3, and may further specify that the PCB has a perimeter region and a central region, and the second heater trace is disposed in the perimeter region.

Example 5 may include the subject matter of Example 4, and may further specify that the interposer is disposed in the central region.

Example 6 may include the subject matter of any of Examples 1-5 and may further specify that the PCB includes a layer having signal routing traces.

Example 7 may include the subject matter of Example 6, and may further specify that the second heater trace is disposed in the layer.

Example 8 may include the subject matter of Example 6, and may further specify that the layer is a first layer, and the second heater trace is disposed in a second layer of the PCB different from the first layer.

Example 9 may include the subject matter of any of Examples 1-8, and may further specify that the PCB includes a metal plane.

Example 10 may include the subject matter of Example 9, and may further specify that the PCB further includes power and ground contacts, and the metal plane is not conductively coupled to the power or ground contacts.

Example 11 may include the subject matter of any of Examples 1-10, and may further specify that a footprint of the second heater trace extends around a footprint of the interposer.

Example 12 may include the subject matter of Example 11, and may further specify that the PCB further includes a third heater trace, and a footprint of the third heater trace extends around the footprint of the second heater trace.

Example 13 may include the subject matter of any of Examples 1-12, and may further include a heater control device, in conductive contact with the first heater trace and the second heater trace, to generate the first power in the first heater trace and a second power in the second heater trace.

Example 14 may include the subject matter of Example 13, and may further specify that the heater control device is detachably coupled to the PCB.

Example 15 may include the subject matter of any of Examples 1-14, and may further include an IC package coupled to the conductive contacts on the interposer.

Example 16 may include the subject matter of Example 15, and may further specify that the IC package includes a processing device.

Example 17 is a method for mitigating warpage in a printed circuit board (PCB) assembly, including: providing a first power to a first heater trace in an interposer disposed on a PCB in the PCB assembly; and providing a second power to a second heater trace in the PCB.

Example 18 may include the subject matter of Example 17, and may further specify that the interposer has a first face and an opposing second face, the first face is disposed between the second face and the PCB, conductive contacts are disposed on the second face, solder is disposed on the conductive contacts, and, when the first power is provided to the first heater trace, the first heater trace generates heat to cause the solder disposed on the conductive contacts to melt.

Example 19 may include the subject matter of any of Examples 17-18, and may further specify that, when the second power is provided to the second heater trace, the second heater trace generates heat to mitigate warpage of the PCB caused by heat generated by the first heater trace.

Example 20 may include the subject matter of any of Examples 17-19, and may further include providing a third power to a third heater trace in the PCB.

Example 21 may include the subject matter of Example 20, and may further specify that the second heater trace is disposed in a central region of the PCB, and the third heater trace is disposed in a perimeter region of the PCB.

Example 22 is a method of manufacturing a printed circuit board (PCB) assembly for warpage mitigation, including: providing first and second insulating layers of a printed circuit board; providing a first heater trace between the first and second insulating layers; providing first conductive contacts on a surface of the second insulating layer; and coupling an interposer to the first conductive contacts, wherein the interposer has a second heater trace, a first face and an opposing second face, the first face is disposed between the second face and the second insulating layer, second conductive contacts are disposed on the second face, solder is disposed on the second conductive contacts, and, when power is provided to the second heater trace, the second heater trace is to generate heat to cause the solder disposed on the second conductive contacts to melt.

Example 23 may include the subject matter of Example 22, and may further specify that the interposer is coupled to the first conductive contacts via solder joints, and when power is dissipated in the first heater trace to mitigate warpage caused by the heat generated by the second heater trace, heat generated by the first heater trace does not melt the solder joints.

Example 24 is a computing device, including: a printed circuit board (PCB); an interposer disposed on the PCB, wherein the interposer has a first face and an opposing second face, the first face is disposed between the second face and the PCB, conductive contacts are disposed on the second face, solder is disposed on the conductive contacts, the interposer includes a first heater trace proximate to the conductive contacts, the PCB includes a second heater trace, and, when a first power is dissipated in the first heater trace, the first heater trace is to generate heat to cause the solder disposed on the conductive contacts to melt; and an IC package coupled to the interposer, wherein the IC package includes a processing device.

Example 25 may include the subject matter of Example 24, and may further specify that the processing device is a central processing unit (CPU).

Example 26 is an apparatus including means for mitigating warpage of a printed circuit board (PCB).

What is claimed is:

1. A printed circuit board (PCB) assembly for warpage mitigation, comprising:
   a PCB; and
   an interposer disposed on the PCB, wherein the interposer has a first face and an opposing second face, the first face is disposed between the second face and the PCB, conductive contacts are disposed at the second face, solder is disposed on the conductive contacts, the interposer includes a first heater trace proximate to the conductive contacts, and, when a first power is dissipated in the first heater trace, the first heater trace is to generate heat to cause the solder disposed on the conductive contacts to melt;
   wherein a second heater trace is embedded in the PCB, and the second heater trace extends around a footprint of the interposer.

2. The PCB assembly of claim 1, wherein, when a second power is dissipated in the second heater trace, the second heater trace is to generate heat to mitigate deformation of the PCB caused by heat generated by the first heater trace.

3. The PCB assembly of claim 2, wherein the interposer is coupled to the PCB via solder joints, and when the second power is dissipated in the second heater trace, the heat generated by the second heater trace does not melt the solder joints.

4. The PCB assembly of claim 1, wherein the PCB has a perimeter region and a central region, and the second heater trace is disposed in the perimeter region.

5. The PCB assembly of claim 4, wherein the interposer is disposed in the central region.

6. The PCB assembly of claim 1, wherein the PCB includes a layer having signal routing traces.

7. The PCB assembly of claim 6, wherein the second heater trace is disposed in the layer.

8. The PCB assembly of claim 6, wherein the layer is a first layer, and the second heater trace is disposed in a second layer of the PCB different from the first layer.

9. The PCB assembly of claim 1, wherein the PCB includes a metal plane.

10. The PCB assembly of claim 9, wherein the metal plane is not conductively coupled to a signal pathway or to power or ground contacts.

11. The PCB assembly of claim 1, wherein the PCB further includes: a third heater trace, and the third heater trace extends around a footprint of the second heater trace.

12. The PCB assembly of claim 1, further comprising:
    a heater control device, in conductive contact with the first heater trace and the second heater trace, to generate the first power in the first heater trace and a second power in the second heater trace.

13. The PCB assembly of claim 12, wherein the heater control device is detachably coupled to the PCB.

14. The PCB assembly of claim 1, further comprising:
    an electrical component coupled to the interposer such that the interposer is between the electrical component and the PCB.

15. A method for mitigating warpage in a printed circuit board (PCB) assembly, comprising:
    providing a first power to a first heater trace in an interposer disposed on a PCB in the PCB assembly; and
    providing a second power to a second heater trace embedded in the PCB, wherein the second heater trace extends around a footprint of the interposer.

16. The method of claim 15, wherein the interposer has a first face and an opposing second face, the first face is disposed between the second face and the PCB, conductive contacts are disposed on the second face, solder is disposed on the conductive contacts, and, when the first power is provided to the first heater trace, the first heater trace generates heat to cause the solder disposed on the conductive contacts to melt.

17. The method of claim 15, wherein, when the second power is provided to the second heater trace, the second heater trace generates heat to mitigate warpage of the PCB caused by heat generated by the first heater trace.

18. The method of claim 15, further comprising:
    providing a third power to a third heater trace in the PCB.

19. The method of claim 18, wherein the second heater trace is disposed in a central region of the PCB, and the third heater trace is disposed in a perimeter region of the PCB.

20. A method of manufacturing a printed circuit board (PCB) assembly for warpage mitigation, comprising:
    aligning an interposer and a PCB, wherein the PCB includes a first heater trace between first and second insulating layers and first conductive contacts on a surface of the second insulating layer; and
    coupling an interposer to the first conductive contacts, wherein the interposer has a second heater trace, a first face and an opposing second face, the first face is disposed between the second face and the second insulating layer, second conductive contacts are disposed on the second face, solder is disposed on the second conductive contacts, the first heater trace extends around a footprint of the interposer, and, when power is provided to the second heater trace, the second heater trace is to generate heat to cause the solder disposed on the second conductive contacts to melt.

21. The method of claim 20, wherein the interposer is coupled to the first conductive contacts via solder joints, and when power is dissipated in the first heater trace to mitigate warpage caused by the heat generated by the second heater trace, heat generated by the first heater trace does not melt the solder joints.

22. A computing device, comprising:
a printed circuit board (PCB);
an interposer disposed on the PCB, wherein the interposer has a first face and an opposing second face, the first face is disposed between the second face and the PCB, conductive contacts are disposed on the second face, solder is disposed on the conductive contacts, the interposer includes a first heater trace proximate to the conductive contacts, the PCB includes an embedded second heater trace that extends around a footprint of the interposer, and, when a first power is dissipated in the first heater trace, the first heater trace is to generate heat to cause the solder disposed on the conductive contacts to melt; and
an IC package coupled to the interposer, wherein the IC package includes a processing device.

23. The computing device of claim 22, wherein the processing device is a central processing unit (CPU).

24. The computing device of claim 22, wherein the PCB includes a metal plane that is not conductively coupled to a signal pathway or to power or ground contacts of the PCB.

25. The computing device of claim 22, wherein the PCB further includes a third heater trace having a footprint that extends around a footprint of the second heater trace.

\* \* \* \* \*